United States Patent

Wang et al.

[11] Patent Number: 6,157,136
[45] Date of Patent: Dec. 5, 2000

[54] FREQUENCY SENSING CONTROL DEVICE

[75] Inventors: Jack Wang, Taichung Hsien; Robert Wang, Taipei, both of Taiwan

[73] Assignee: Ceramate Technical Co., Ltd., Tao-Yuan Hsien, Taiwan

[21] Appl. No.: 09/480,412

[22] Filed: Jan. 11, 2000

[51] Int. Cl.[7] .................................................. H05B 37/02
[52] U.S. Cl. ........................... 315/158; 315/159; 340/565
[58] Field of Search ..................................... 340/540, 541, 340/565; 315/158, 159, 291

[56] References Cited

U.S. PATENT DOCUMENTS 5,130,613  7/1992  Szuba ........................................ 315/291

Primary Examiner—David Vu
Attorney, Agent, or Firm—Merchant & Gould P.C.

[57] ABSTRACT

A frequency sensing control device controls current flow through an electrical load and includes a current control circuit to be connected to the electrical load, a logic signal generator having an input port and an output port connected to a control input of the current control circuit, an oscillator connected to the logic signal generator, and a sensing unit connected to the oscillator for sensing human presence. The current control circuit is operable in a normal mode, where the control input receives a first logic signal generated by the logic signal generator when the input port receives a high-frequency signal so as to enable the current control circuit to maintain an initial current flow through the electrical load, and a dimming mode, where the control input receives a second logic signal generated by the logic signal generator when the input port receives a low-frequency signal so as to enable the current control circuit to vary the current flow through the electrical load. The oscillator is operable so as to provide the high-frequency signal to the input port. The sensing unit generates the low-frequency signal, inhibits the oscillator from providing the high-frequency signal to the input port, and provides the low-frequency signal to the input port via the oscillator.

9 Claims, 3 Drawing Sheets

FREQUENCY SENSING CONTROL DEVICE

BACKGROUND OF THE INVENTION

1. Field of the Invention

The invention relates to a load control device, more particularly to a frequency sensing control device for an electrical load.

2. Description of the Related Art

A conventional electronic equipment has a mechanical control switch to control the supply of electrical power thereto. In addition, a static electricity sensing control device has been designed to provide a dimming function to an electrical load, such as a bed lamp. When a human body contacts a sensing unit, such as a metal shell of the bed lamp, the sensing unit senses a static electricity signal that serves as an input signal for controlling current flow through the electrical load. Because the human body must directly contact the sensing unit, there is a danger of electric shock.

SUMMARY OF THE INVENTION

Therefore, the object of the present invention is to provide a frequency sensing control device that can control current flow through an electrical load without the need for direct contact with a sensing unit.

According to the present invention, a frequency sensing control device is adapted to control current flow through an electrical load, and includes a current control circuit, a logic signal generator, an oscillator and a sensing unit.

The current control circuit is adapted to be connected to the electrical load and has a control input. The current control circuit is operable in a normal mode, where the control input receives a first logic signal so as to enable the current control circuit to maintain an initial current flow through the electrical load, and a dimming mode, where the control input receives a second logic signal so as to enable the current control circuit to vary the current flow through the electrical load.

The logic signal generator has an input port and an output port connected to the control input of the current control circuit. The logic signal generator generates the first logic signal when the input port receives a high-frequency signal, and the second logic signal when the input port receives a low-frequency signal.

The oscillator is connected to the logic signal generator and is operable so as to provide the high-frequency signal to the input port.

The sensing unit is adapted to sense static electricity radiated by a human body and is connected to the oscillator. The sensing unit generates the low-frequency signal, inhibits the oscillator from providing the high-frequency signal to the input port, and provides the low-frequency signal to the input port through the oscillator upon sensing the static electricity radiated by the human body.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
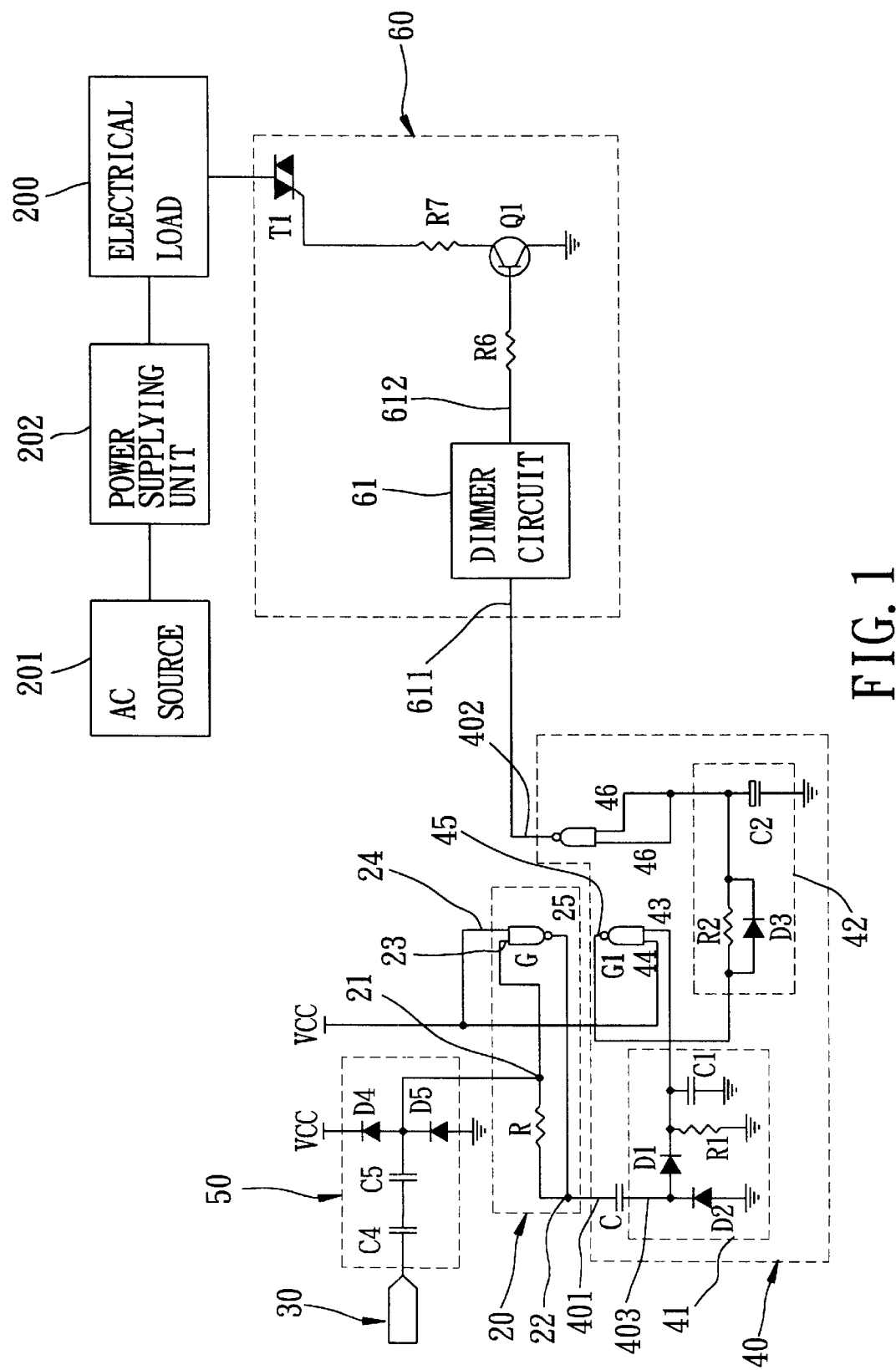
FIG. 1 is a schematic electrical circuit diagram illustrating the preferred embodiment of a frequency sensing control device according to the present invention.

Referring to FIG. 1, according to the preferred embodiment of this invention, a frequency sensing control device is adapted to control current flow through an electrical load 200 and is shown to include a current control circuit 60, a logic signal generator 40, an oscillator 20, a sensing unit 30, and isolating means 50. An AC source 201 provides electrical power to the electrical load 200 via a power supplying unit 202.

The current control circuit 60 is adapted to be connected to the electrical load 200, and has a control input 611. The current control circuit 60 is operable in a normal mode, where the control input 611 of the dimmer circuit 61 receives a high logic signal so as to enable the current control circuit 60 to maintain an initial current flow through the electrical load 200, and a dimming mode, where the control input 611 of the dimmer circuit 61 receives a low logic signal so as to enable the current control circuit to vary the current flow through the electrical load 200. The current control circuit 60 includes a thyristor (T1) adapted to be connected to the electrical load 200, a bias transistor (Q1) connected to the thyristor (T1) via a resistor (R7), and a dimmer circuit 61 having the control input 611 and a control output 612 connected to the bias transistor (Q1) via a resistor (R6). The dimmer circuit 61, such as the TT6303 dimmer integrated circuit designed by TONTEK DESIGN TECHNOLOGY LTD. Of Taiwan, provides a variable bias voltage to the bias transistor (Q1) to control conduction angle of the thyristor (T1) and vary the current flow through the electrical load 200 in accordance with the duration of the low logic signal.

The logic signal generator 40 has an input port 401, and an output port 402 connected to the control input 611 of the current control circuit 60. The logic signal generator 40 generates the high logic signal when the input port 401 receives a high-frequency signal, and the low logic signal when the input port 401 receives a low-frequency signal. The logic signal generator 40 includes a high-pass capacitor (C), a first charge-discharge circuit 41, a first NAND gate (G1), a second charge-discharge circuit 42, and a second NAND gate (G2). The high-pass capacitor (C1) has a first capacitor terminal that serves as the input port 401, and a second capacitor terminal 403. The first charge-discharge circuit 41 is connected to the second capacitor terminal 403. The first charge-discharge -circuit 41 is charged by the high-frequency signal through the high-pass capacitor (C), and discharges when the high-pass capacitor (C) receives the low-frequency signal. The first charge-discharge circuit 41 has a first capacitor (C1) having a first end and a grounded second end, a first resistor (R1) connected in parallel to the first capacitor (C1), a first diode (D1) having an anode connected to the second capacitor terminal 403 and a cathode connected to the first end of the first capacitor (C1) and the first resistor (R1), and a second diode (D2) having a grounded end and a cathode connected to the second capacitor terminal 403 and the anode of the first diode (D1). The first NAND gate (G1) has a first input 43 connected to the first end of the first capacitor (C1), the first resistor (R1) and the cathode of the first diode (D1), a second input 44 connected to a supply voltage source (VCC), and an output 45. The second charge-discharge circuit 42 is connected to the output 45 of the first NAND gate (G1) so as to be charged thereby. The second charge-discharge circuit 42 has a diode (D3) having an anode connected to the output 45 of the first NAND gate (G1) and a cathode, a second resistor (R2) connected in parallel to the diode (D3), and a second capacitor (C2) having a first end connected to the cathode of the diode (D3) and the second resistor (R2), and a grounded second end. The second NAND gate (G2) has two inputs 46 connected to the second capacitor (C2), the second resistor (R2) and the cathode of the diode (D3), and an output that serves as the output port 402 connected to the control input 611 of the dimmer circuit 61 of the current control circuit 60.

The oscillator 20 is connected to the logic signal generator 40, and is operable so as to provide the high-frequency signal to the input port 401. The oscillator 20 includes a resistor (R) having first and second terminals 21, 22, and a NAND gate (G) having first and second inputs (23, 24) and an output 25. The first terminal 21 of the resistor (R) and the first input 23 of the NAND gate (G) are connected to the sensing unit 30. The second terminal 22 of the resistor (R) and the output 25 of the NAND gate (G) are connected to the input port 401 of the logic signal generator 40. The second input 24 of the NAND gate (G) is connected to the supply voltage source (VCC). The resistor (R) has a high resistance sufficient to cause the high-frequency signal to be within a range of from 1 to 4 MHz.

The isolating means 50 is connected to the oscillator 20 and the sensing unit 30 to isolate the oscillator 20 from the static electricity radiated by a human body. The isolating means 50 includes two diodes (D4, D5) and two capacitors (C4, C5). The diode (D4) has an anode, and a cathode connected to the supply voltage source (VCC). The diode (D5) has a grounded anode, and a cathode connected to the anode of the diode (D4), the first terminal 21 of the resistor (R), the first input 23 of the NAND gate (G), and the capacitor (CS). The capacitor (C4) is connected in series to the capacitor (C5)

The sensing unit 30 is connected to the capacitor (C4) of the isolating means 50, and is adapted to sense static electricity radiated by a human body. The sensing unit 30 generates the low-frequency signal, inhibits the oscillator 20 from providing the high-frequency signal to the input port 401, and provides the low-frequency signal to the input port 401 through the oscillator 20 upon sensing the static electricity radiated by the human body.

Under normal conditions, no human body is proximate to the sensing unit 30. The oscillator 20 generates the high-frequency signal and provides the same to the input port 401 of the logic signal generator 40. The first charge-discharge circuit 41 is changed by the high-frequency signal via the capacitor (C), and generates a high logic output signal to the first input 43 of the first NAND gate (G1). The first NAND gate (G1) outputs a low logic output signal to the second charge-discharge circuit 42. The second charge-discharge circuit 42 generates a low logic output signal to the second NAND gate (G2). The second NAND gate outputs the high logic signal to the control input 611 of the current control circuit 60 so as to enable the current control circuit to maintain the initial current flow through the electrical load 200.

When a human body is proximate to the sensing unit 30, the sensing unit 30 senses the static electricity radiated by the human body. At this time, the sensing unit 30 provides the 60 Hz low-frequency signal to the input port 401 of the logic signal generator 40 via the oscillator 20. Due to the high-pass characteristics of the capacitor (C), the first charge-discharge circuit 41 discharges and provides a low logic output signal to the first input 43 of the first NAND gate (G1). The first NAND gate (G1) outputs a high logic output signal to the second charge-discharge circuit 42, thereby charging the same. The second charge-discharge circuit 42 generates a high logic output signal to the second NAND gate (G2). The logic signal generator 40 outputs the low logic signal to the control input 611 of the dimmer circuit 61 so as to provide the variable bias voltage to the bias transistor (Q1) to control the conduction angle of the thyristor (T1) and vary the current flow through the electrical load 200 in accordance with the duration of the low logic signal.

Figure 2:
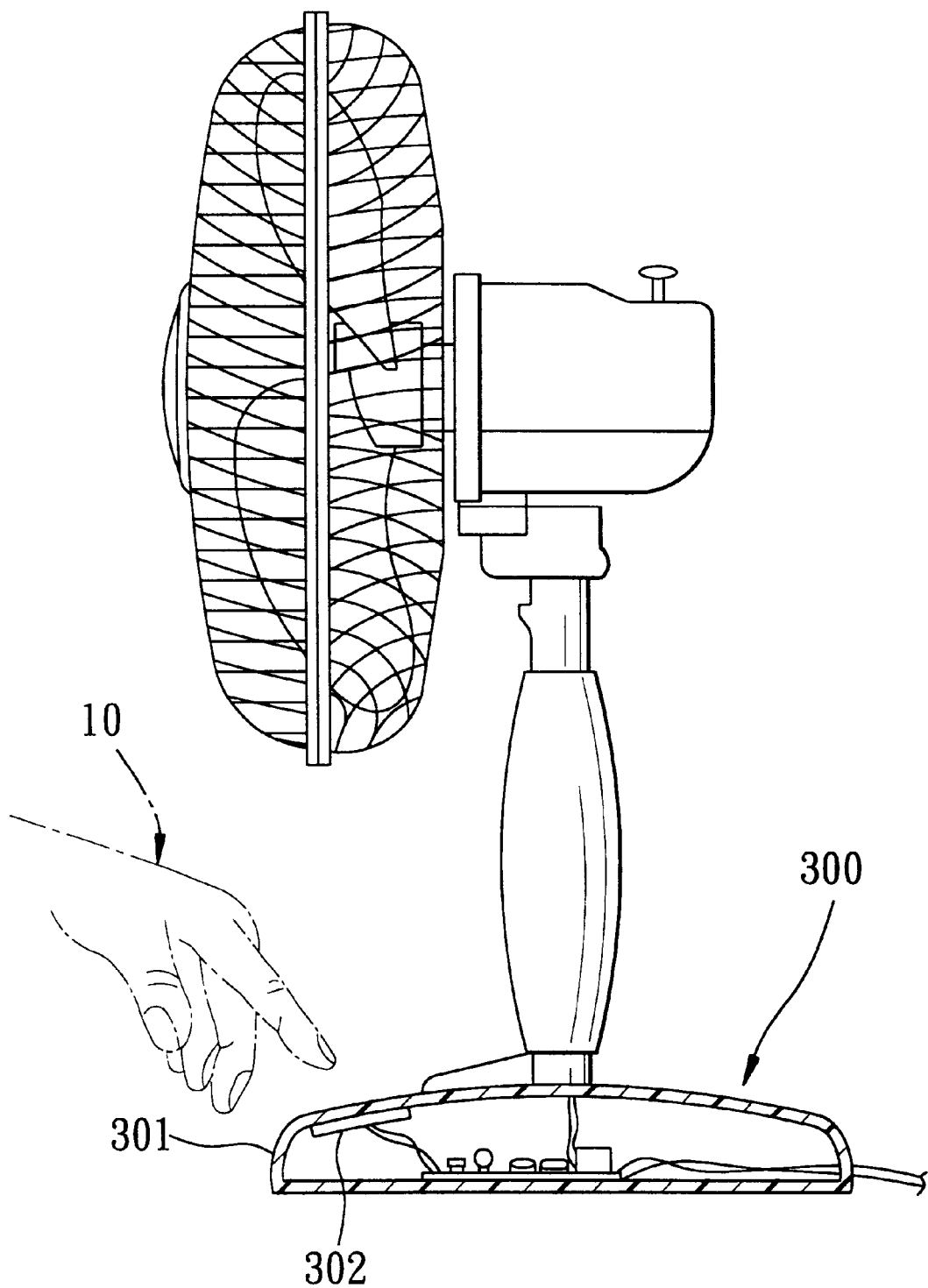
FIG. 2 is a schematic view of the preferred embodiment when applied to an electric fan.
Figure 3:
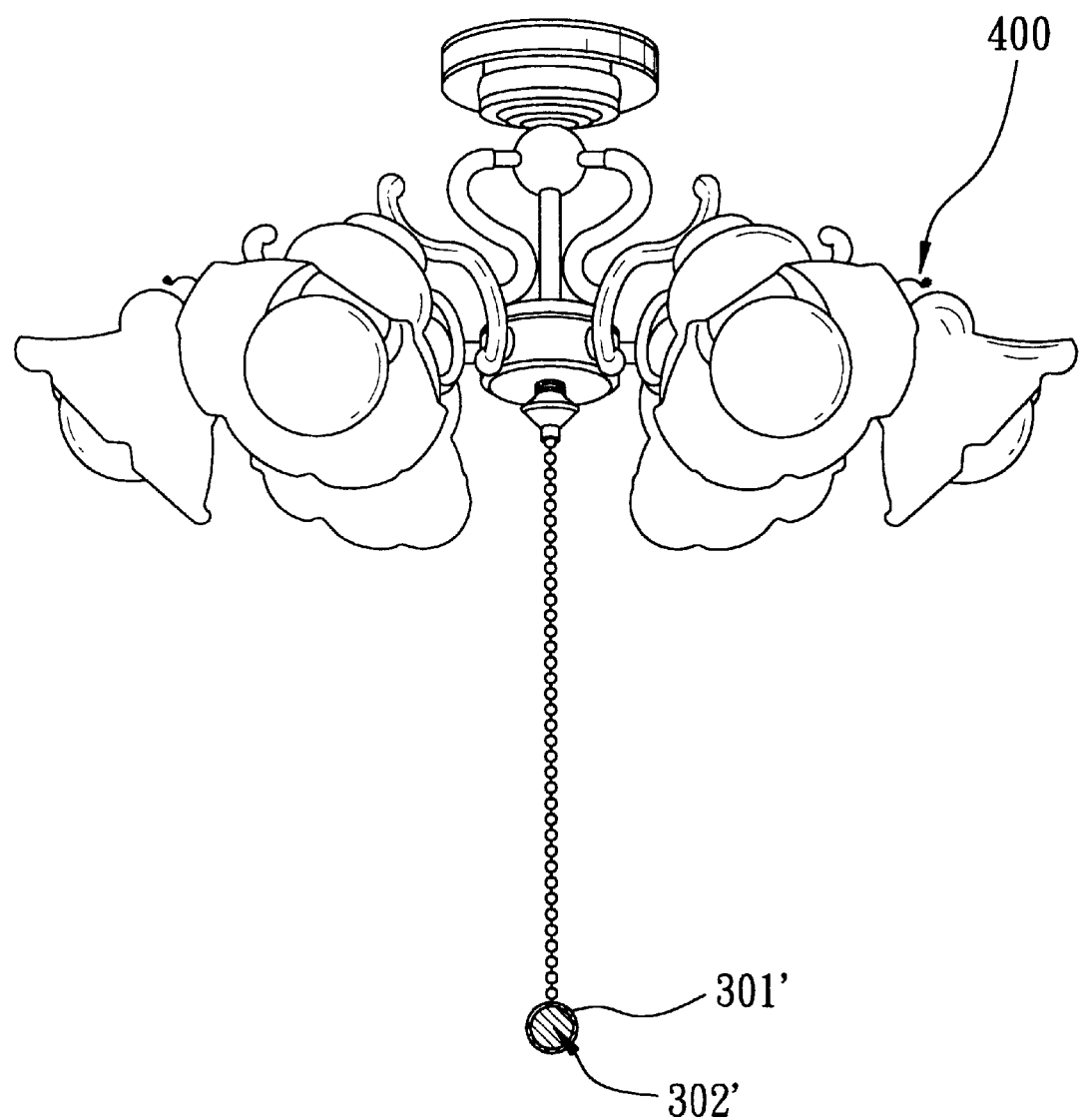
FIG. 3 is a schematic view of the preferred embodiment when applied to a ceiling lamp.

FIG. 2 illustrates the preferred embodiment when applied to an electric fan 300. A conductor plate 302 serves as a conductor member of the sensing unit. A plastic shell 301 of the fan 300 serves as an insulator layer that encloses the conductor plate 302. When a human body part 10 is proximate to the sensing unit, the frequency sensing control device of this invention can control the rotation speed of the fan 300. FIG. 3 illustrates the preferred embodiment when applied to a ceiling lamp 400. A metal ball 302' serves as the conductor member of the sensing unit. The metal ball 302'is enclosed by an insulator layer 301'. When a human body part is proximate to the sensing unit, the frequency sensing control device of this invention can control the brightness of the ceiling lamp 400.

It is noted that the human body need not contact the sensing unit to control the electrical load, thereby resulting in enhanced safety. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A frequency sensing control device adapted to control current flow through an electrical load, comprising:

a current control circuit adapted to be connected to the electrical load and having a control input, said current control circuit being operable in a normal mode, where said control input receives a first logic signal so as to enable said current control circuit to maintain an initial current flow through the electrical load, and a dimming mode, where said control input receives a second logic signal so as to enable said current control circuit to vary the current flow through the electrical load;

a logic signal generator having an input port and an output port connected to said control input of said current control circuit, said logic signal generator generating the first logic signal when said input port receives a high-frequency signal, and the second logic signal when said input port receives a low-frequency signal;

an oscillator connected to said logic signal generator and operable so as to provide the high-frequency signal to said input port; and a sensing unit adapted to sense static electricity radiated by a human body and connected to said oscillator, said sensing unit generating the low-frequency signal, inhibiting said oscillator from providing the high-frequency signal to said input port, and providing the low-frequency signal to said input port through said oscillator upon sensing the static electricity radiated by the human body.

2. The frequency sensing control device of claim 1, wherein said current control circuit varies the current flow through the electrical load in accordance with duration of the second logic signal.

3. The frequency sensing control device of claim 2, wherein said current control circuit includes a thyristor adapted to be connected to the electrical load, a bias transistor connected to said thyristor, and a dimmer circuit having said control input and a control output connected to said bias transistor, said dimmer circuit providing a variable bias voltage to said bias transistor to control conduction angle of said thyristor and vary the current flow through the electrical load in accordance with the duration of the second logic signal.

4. The frequency sensing control device of claim 1, wherein said sensing unit includes a conductor member and an insulator layer that encloses said conductor member.

5. The frequency sensing switch device of claim 1, wherein said oscillator includes a resistor having first and second terminals, and a NAND gate having first and second inputs and an output, said first terminal of said resistor and said first input of said NAND gate being connected to said sensing unit, said second terminal of said resistor and said output of said NAND gate being connected to said input port of said logic signal generator, said second input of said NAND gate being connected to a supply voltage source.

6. The frequency sensing control device of claim 5, wherein said resistor has a high resistance sufficient to cause the high-frequency signal to be within a range of from 1 to 4 MHz.

7. The frequency sensing control device of claim 1, wherein said logic signal generator includes:

a high-pass capacitor having a first capacitor terminal that serves as said input port, and a second capacitor terminal;

a first charge-discharge circuit connected to said second capacitor terminal, said first charge-discharge circuit being charged by the high-frequency signal through said high-pass capacitor, and discharging when said high-pass capacitor receives the low-frequency signal;

a first NAND gate having a first input connected to said first charge-discharge circuit, a second input connected to a supply voltage source, and an output; and a second charge-discharge circuit connected to said output of said first NAND gate so as to be charged thereby.

8. The frequency sensing control device of claim 7, wherein said logic signal generator further includes a second NAND gate having two inputs connected to said second charge-discharge circuit, and an output that serves as said output port connected to said control input of said current control circuit.

9. The frequency sensing control device of claim 1, further comprising isolating means connected to said oscillator and said sensing unit to isolate said oscillator from the static electricity radiated by the human body.

* * * * *